United States Patent [19]

Lode

[11] 3,828,345

[45] Aug. 6, 1974

[54] AMPLIFIER BUFFERED RESISTANCE NETWORK DIGITAL TO ANALOG AND ANALOG TO DIGITAL CONVERTER SYSTEM

[76] Inventor: Tenny D. Lode, 3270 Cherryridge Rd., Cherry Hills Village, Colo. 80110

[22] Filed: Jan. 4, 1973

[21] Appl. No.: 320,933

[52] U.S. Cl. ..... 340/347 DA, 340/347 AD, 330/127

[51] Int. Cl. .......... H03k 13/04

[58] Field of Search .......... 340/347 DA, 347 AD; 330/127

[56] References Cited

UNITED STATES PATENTS

| | | | |
|---|---|---|---|
| 2,976,527 | 3/1961 | Smith | 340/347 DA |
| 3,129,420 | 4/1964 | Marez | 340/347 DA |
| 3,290,671 | 12/1966 | Lamoureux | 340/347 DA |
| 3,678,504 | 7/1972 | Kaneko | 340/347 DA |
| 3,714,599 | 1/1973 | Cecil | 340/347 DA |
| 3,719,808 | 3/1973 | Booth, Jr. | 340/347 DA |

*Primary Examiner*—Charles D. Miller

*Attorney, Agent, or Firm*—Dugger, Johnson & Westman

[57] ABSTRACT

Voltage follower amplifiers are used between the voltage switches and the resistor network of an otherwise conventional parallel resistor network digital to analog converter. A principal advantage is that errors due to the internal resistances of the electronic voltage switches are greatly reduced.

6 Claims, 8 Drawing Figures

AMPLIFIER BUFFERED RESISTANCE NETWORK DIGITAL TO ANALOG AND ANALOG TO DIGITAL CONVERTER SYSTEM

BACKGROUND OF THE INVENTION

When digital computers are used to measure or control the operation of equipment, processes or systems, it is often desirable to give the computer the ability to sense and measure analog inputs (such as voltages or currents which may vary over a given range) in addition to discrete or digital inputs (e.g., from switches or pushbuttons). For example, if a digital computer is to be used to monitor a chemical process, it must be able to measure temperatures, pressures and/or other process variables. The usual way of doing this is to employ one or more analog to digital converters which allow the digital computer to measure analog voltages and/or currents. The analog to digital converter(s) measure signals from various transducer circuits which convert temperature, pressure and other measurements into analog voltages and/or currents.

It may also be desirable to provide analog outputs from the computer (variable in small steps over a given range) in addition to the usual digital outputs (e.g., simple ON or OFF signals). For example, one may wish to draw pictures on the screen of a cathode ray tube or with an analog chart plotter, or provide analog signals which can be used to control valves, motors, visual indicators, or for other purposes. The usual way of doing this is to employ one or more digital to analog converters which allow the digital computer to control analog voltages and/or currents.

Given either a digital to analog converter or an analog to digital converter, it is possible to construct the complementary type of converter using appropriate feedback circuits. It is a common practice to construct medium to high accuracy. medium to high speed analog to digital converters by using a digital to analog converter and feedback circuits. The systems which are the subject of this disclosure are of this type. That is, this disclosure shows a digital to analog converter which is reasonably direct and straightforward, and an analog to digital converter which incorporates a digital to analog converter and feedback control circuits so as to generate a digital number corresponding to an analog input signal.

In one form of conventional resistor network digital to analog converter, a number of voltage switches are connected to the input terminals of a multiple resistor summing network. The voltage switches serve to connect the input terminals to one or the other of two reference voltage lines, depending on the values of the individual bits of a controlling digital number. In a binary digital to analog converter, the resistor network is arranged so that the voltage output from a first switch is given a relative weight of one-half, the voltage output from a second switch is given a relative weight of one-fourth, and in general, the voltage output from the "$n^{th}$" switch is given a relative weight of $2^{-n}$.

Conventional high accuracy, resistor network digital to analog converters normally incorporate a number of adjustment elements. These elements are usually variable potentiometers or resistors and are adjusted at the time of manufacture and from time to time as may be required. The adjustments are of two types. The first type is the adjustments for setting the full scale range of the analog output voltage. For example, in a converter designed to cover the range of 0 to 10 volts, there will normally be one adjustment which is used to set the analog output to precisely 0 volts for a digital value of zero, and a second adjustment to set the output to precisely 10 volts when the digital number is at its maximum value. The procedures for setting these adjustments are relatively straightforward. In many instances, there is no need for such range adjustments and they may be ignored or eliminated entirely. The equivalent functions may be obtained by calibrating the converter and making appropriate corrections to the digital numbers. For example, if it is known that the converter output is always 10 millivolts low as an example, then a digital quantity corresponding to 10 millivolts may be added to all digital numbers before conversion. Similar corrections may be made to digital numbers resulting from analog to digital conversions, thereby avoiding the need for adjustment of the range of an analog to digital converter.

A second type of adjustment is the adjustments which are usually provided for individual bit circuits. Using an eight-bit converter as an example, the problem is that the voltage developed by the converter in response to a digital input of 10000000 may not be exactly one increment larger than the voltage developed for 01111111. If the effective weighting values of the resistor network are such that the weight given to the most significant bit is slightly low, then the voltage generated for a conversion of 10000000 may actually be less than the voltage obtained for the conversion of 01111111. Adjustments are usually provided to set the weighting given to some number of the most significant bits so as to overcome this problem. Unfortunately, setting the individual bit adjustments tends to require more time and skill than setting the full scale range of the converter.

It is a significant advantage in both the manufacture and use of digital to analog and analog to digital converters if such individual bit adjustments can be avoided. Two of the major potential sources of errors in the individual bit circuits of conventional digital to analog converters are: (1) Insufficient accuracy and/or stability of the resistor network, and (2) the offset voltages and internal resistances of the individual analog switches and the time variations thereof.

Precision resistor networks are now available commercially with ratio accuracies of 10 parts per million and better. This compares favorably with one step of, for example, a 15-bit converter (30 parts per million). If hermetically sealed resistors are used for the three or four most significant bits, an entire 15-bit network may be constructed which will have a better than 15-bit stability for many years without adjustment.

What is perhaps the most severe limitation of conventional resistor network, high accuracy digital to analog converters is the errors due to the offset voltages and/or internal resistances of the individual analog switches. In such conventional digital to analog converters, a great deal of care and expense is lavished upon the problem of the analog voltage switches. Bipolar switches are generally not suitable for converters of the 15-bit class because of their voltage offsets. FET switches have no internal offset voltages, but the internal resistances are generally higher than would be desired. Commercially available MOSFET devices typically have internal resistances of several hundred ohms.

Ordinary junction FET switches typically have internal resistances of 30 to 100 ohms. Special junction FET switches are available with internal resistances down to approximately 4 ohms. However, these tend to be relatively expensive and are often a proprietary device available from only a single vendor. It is, of course, possible to obtain low switch resistances by using a number of FET switches in parallel. However, as one attempts to decrease the resistance of the parallel FET array much below the resistance of an individual FET, the number of required FETs increases quite rapidly.

The resistor network used in a digital to analog converter is commonly in the form of a ladder network composed of individual resistors whose values are R and 2R. From the standpoint of stability and moderate cost, the R value of presently available ladder networks should be in the range of 1,000 to perhaps 15,000 ohms. Unfortunately, the internal resistance of an FET switch (like other semiconductor resistances) is not particularly stable with time or temperature. If we assume special FET switches and/or large parallel arrays, we might assume a switch resistance stability of (say) 2 ohms. If we ask that the switch resistance error contribute less than (say) 10 parts per million to the output voltage error, this implies a value for 2R of the order of 100,000 ohms or greater. This is an inconveniently high output impedance for the entire ladder network and greatly increases any errors due to output loading. The result is that conventional resistor network, high accuracy digital to analog converters will operate at full accuracy only over a limited temperature range and/or require frequent adjustment of their individual bit circuits.

Conventional digital to analog and analog to digital converters are shown and described in the book "Analog-to-Digital/Digital-to-Analog conversion Techniques" by David F. Hoeschele, Jr., published by John Wiley and Sons, Inc., New York, Library of Congress Catalog Card No. 68–22305. Hoeschele shows in Figure 6.20 a digital to analog converter employing multiple low resistance FET switches and generally describes the design and error analysis of such converters.

SUMMARY OF THE INVENTION

In the present invention, voltage follower amplifiers are used between the analog voltage switches and the input terminals of a multiple resistor summing network. This greatly reduces the effects of the internal resistances of the analog switches, and allows the use of less expensive analog switching elements. It also allows the characteristic resistance of the resistor network to be reduced, thereby reducing errors due to output loading and allowing the resistance values to be chosen for optimum stability of the resistor network. Inexpensive voltage follower amplifiers tend to have voltage offsets which may be greater than the accuracy and resolution which may be desired from a digital to analog converter. However, as will be shown in the following description of the preferred embodiments, such offsets need not adversely affect the overall conversion resolution and accuracy.

DESCRIPTION OF THE PREFERRED EMBODIMENTS

Figure 1:
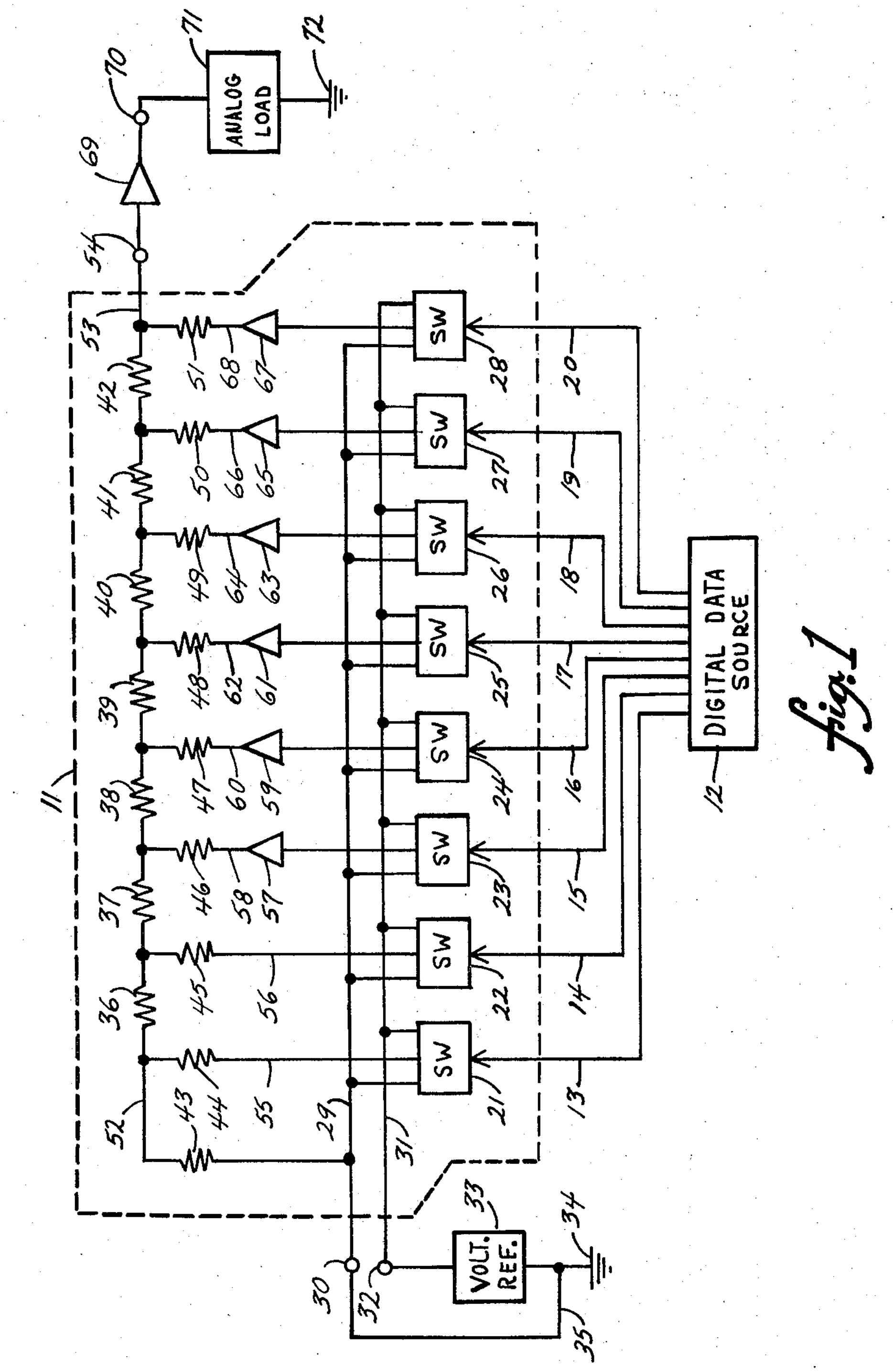
FIG. 1 is a circuit diagram showing a first form of the invention arranged as a digital to analog converter and incorporating a ladder type resistor network for the summation of individual analog voltages.

Reference is now made to FIG. 1 which is a circuit diagram showing a first form of the invention, arranged as a digital to analog converter, and incorporating a ladder type resistor network for the summation of individual analog voltages. FIG. 1 includes digital to analog converter 11 and digital data source 12. Digital data source 12 is connected to digital to analog converter 11 via lines 13, 14, 15, 16, 17, 18, 19, and 20 which connect to the control inputs of analog switches 21, 22, 23, 24, 25, 26, 27, and 28 respectively. Line 29 is connected to reference voltage terminal 30 and to a first or high analog input of each of analog switches 21 through 28. Line 31 is connected to reference voltage terminal 32 and to a second or low analog input of each of analog switches 21 through 28. Voltage reference 33 is connected between terminal 32 and ground 34. Terminal 30 is connected via line 35 to ground 34. The ladder type resistor network includes resistors 36, 37, 38, 39, 40, 41, 42, 43, 44, 45, 46, 47, 48, 49, 50, and 51. Resistors 36 through 42 are connected in a series string between line 52 and line 53, which is connected to analog output terminal 54. Resistor 43 is connected between line 52 and line 29. The output of analog switch 21 on line 55 is connected via resistor 44 to line 52. The output of analog switch 22 on line 56 is similarly connected via resistor 45 to the junction between resistors 36 and 37. The output of analog switch 23 is connected to the input of voltage follower amplifier 57 whose output on line 58 is connected via resistor 46 to the junction between resistors 37 and 38. Similarly, the output of analog switch 24 is connected to the input of voltage follower amplifier 59 whose output on line 60 is connected via resistor 47 to junction between resistors 38 and 39; the output of analog switch 25 is connected to the input of voltage follower amplifier 61 whose output on line 62 is connected via resistor 48 to the junction between resistors 39 and 40; the output of analog switch 26 is connected to the input of voltage follower amplifier 63 whose output on line 64 is connected via resistor 49 to the junction between resistors 40 and 41; the output of analog switch 27 is connected to the input of voltage follower amplifier 65 whose output on line 66 is connected via resistor 50 to the junction between resistors 41 and 42; and the output of analog switch 28 is connected to the input of voltage follower amplifier 67 whose output on line 68 is connected via resistor 51 to line 53. Analog output terminal 54 is connected to the input of voltage follower amplifier 69 whose output is connected to terminal 70. Analog load 71 is connected between terminal 70 and ground 72. Voltage follower amplifier 69 is a unity gain amplifier which provides a signal on terminal 70 which is substantially equal to the signal on terminal 54 and which is connected to analog load 71.

In the system of FIG. 1, converter 11 is an eight-bit digital to analog converter which generates an analog voltage on terminal 54 corresponding to the eight-bit digital data word transmitted by digital data source 12. Digital data source 12 is a source of an eight-bit digital data word. Data source 12 may be a digital computer, a set of manually operated switches, or such other digital data source as may be desired. The digital data number is transmitted as a group of parallel logic level signals via lines 13 through 20 to digital to analog converter 11. The least significant bit of the data word is carried by line 13 and the most significant by line 20. Analog switches 21 through 28 are controlled by the 8 logic level signals corresponding to the digital data word from data source 12. If the signal on line 13 is low, representing a logical 0, analog switch 21 will connect line 55 to line 29. If the signal on line 13 is high, representing a logical 1, analog switch 21 will connect line 55 to line 31. Analog switches 22 through 28 are similarly controlled by the logical signals on lines 14 through 20 which represent the corresponding individual bits of the eight-bit digital data word forming the input.

Two reference voltages are applied to reference voltage terminals 30 and 32. In FIG. 1, reference voltage terminal 30 is connected to ground 34 which considered to be a zero voltage point. Voltage reference 33 provides the desired reference voltage on reference voltage terminal 32. In a system designed for an analog output range of 0 to 5 volts for example, the reference voltage on terminal 32 would be one increment greater than the desired 5 volt full scale range, or 5.02 volts. In higher accuracy systems, greater magnitude and usually balanced reference potentials have been used, such as ± 8 volts and ± 10 volts.

The output of analog switch 23 is connected to the input of voltage follower amplifier 57, which provides a signal on line 58 substantially equal to the output of switch 23. Amplifier 57 is a voltage follower amplifier whose gain is nearly equal to 1. The difference between the two voltages on line 58 for high and low signals on line 15 will be nearly equal to the difference in the voltages on terminals 30 and 32. Switches 24 through 28 similarly drive the inputs of amplifiers 59, 61, 63, 65, and 67 in accordance with the signals on lines 16 through 20. Suitable circuits for switches 21 through 28 and amplifiers 57, 59, 61, 63, 65, and 67 will be described subsequently in greater detail.

Resistors 36 through 51 form a ladder type resistor network of the type commonly used in digital to analog converters. Such networks, when arranged for the conversion of binary digital data words, are sometimes known as R–2R networks. Series resistors 36, 37, 38, 39, 40, 41, and 42 are normally of a first resistance value R and resistors 43, 44, 45, 46, 47, 48, 49, 50, and 51 are normally of a second resistance value, 2R or twice the first resistance value. In experimental models constructed in accordance with the present invention, the R value used for the resistor networks has been typically in the range of 2,000 to 5,000 ohms.

As mentioned previously, one of the significant sources of error in a conventional parallel resistor network digital to analog converter is the loading effect of the resistor network upon the analog switches. Generally, the error due to loading effects upon the switches used for the less significant bits will not be serious as the voltage outputs of the switches, and any errors therein have only a small influence of the summed converter output. However, any loading errors upon the switches used for the most significant bits will have a much greater effect. In the system of FIG. 1, no attempt is made to reduce the loading effects upon switches 21 and 22 as their outputs contribute only one and two steps out of a total range of 255 steps as shown. An error of even several percent in the voltage on line 55 and/or line 56 would not produce a significant error in the voltage on terminal 54. Amplifiers 57, 59, 61, 63, 65, and 67 are used to substantially reduce the loading effects upon switches 23 through 28 where errors caused by loading would be significant. The use of these voltage follower amplifiers between the switches and the resistors allows the use of relatively inexpensive analog switches or switching elements in switches 23 through 28 and a resistor network R value of a convenient and moderate value.

It is possible to use chopper circuits and/or other techniques to reduce the offset voltage, that is, the difference between the input and output voltages of a voltage follower amplifier, to substantially zero. However, it is usually not necessary. A constant offset voltage from amplifier 57 for example, will cause a small constant offset voltage in the converter output on terminal 54. In general, whatever the offset voltages of amplifiers 57, 59, 61, 63, 65 and/or 67 may be, their total effect will be to produce a summed offset voltage on terminal 54 which will probably be less than the offset voltage of an individual amplifier. This constant offset voltage may be trimmed out by adjustment of the voltages on reference terminals 30 and/or 32, corrected otherwise as desired, or in many cases simply ignored. It may also be compensated for by appropriate adjustment of the digital data values.

Figure 2:
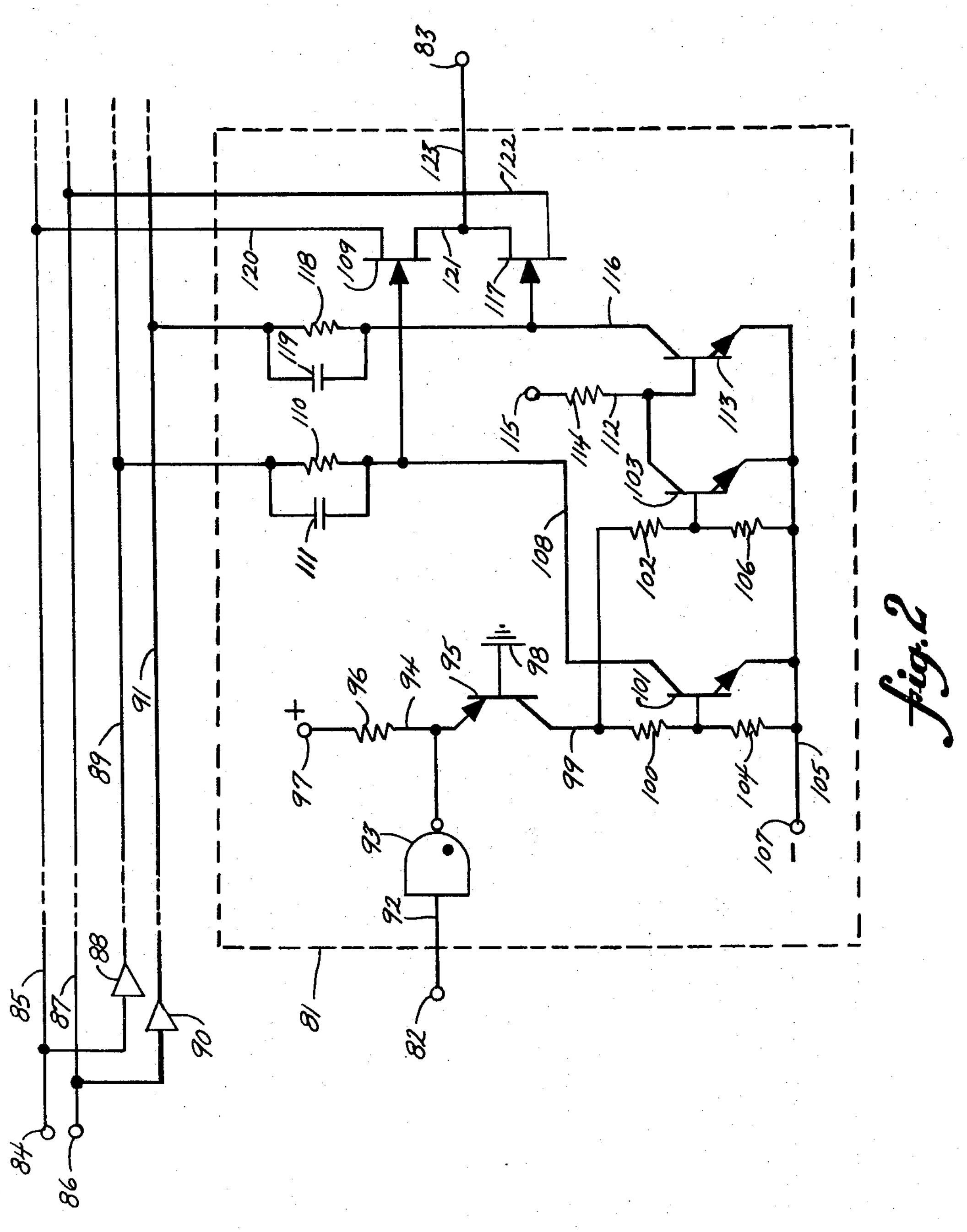
FIG. 2 is a circuit diagram showing a field effect transistor type analog switch which may be used for the analog switches shown in FIGS. 1 and 7.
Figure 7:
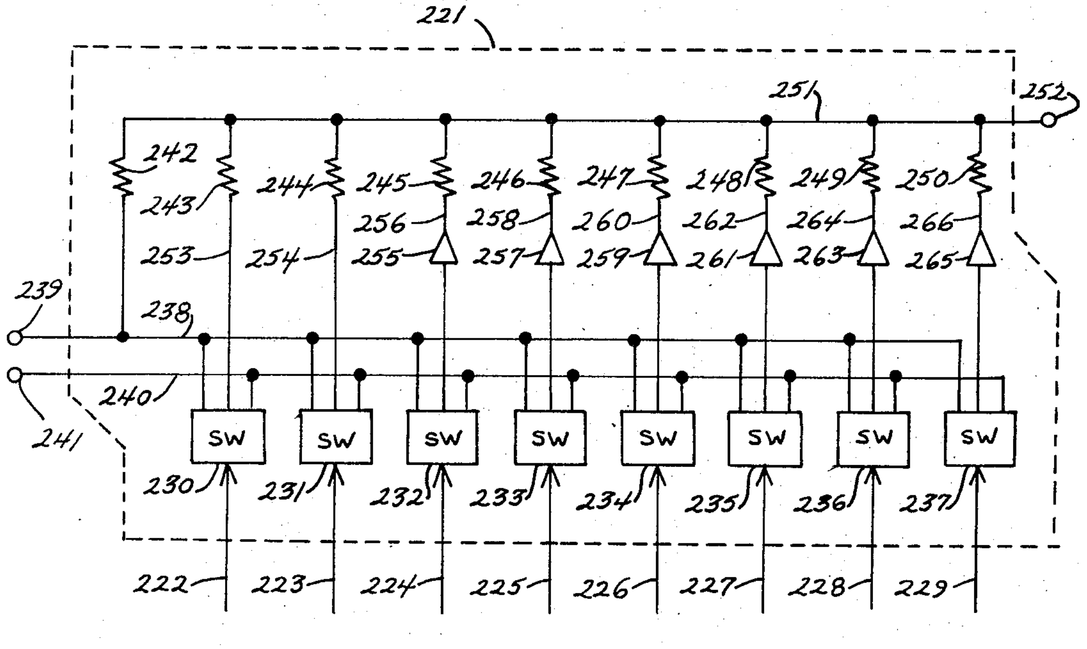
FIG. 7 is a circuit diagram showing a second form of the invention arranged as a digital to analog converter and incorporating a current summing resistor network for the summation of individual analog voltages.

Reference is now made to FIG. 2 which is a circuit diagram showing a field effect transistor type analog switch which may be used for the analog switches shown in FIGS. 1 and 7. In FIG. 2, analog switch 81 is connected to control input terminal 82 and to output terminal 83. Reference voltage terminal 84 is connected to line 85 which is also connected to the input of voltage follower amplifier 88. The output of amplifier 88 is connected to line 89. Reference voltage terminal 86 is connected to line 87 which is also connected to the input of voltage follower amplifier 90.

The output of amplifier 90 is connected to line 91. In analog switch 81, control input terminal 82 is connected via line 92 to the input of open collector inverter 93. The output of inverter 93 is connected to line 94 which is connected to the emitter of PNP transistor 95. Resistor 96 is connected from line 94 to power supply terminal 97. The base of transistor 93 is connected to ground 98 and its collector is connected to line 99. Line 99 is connected via resistor 100 to the base of NPN transistor 101, and via resistor 102 to the base of NPN transistor 103. The base of transistor 101 is connected via resistor 104 to line 105 which is connected to power supply terminal 107. Line 105 is also connected via a resistor 106 to the base of transistor 103. The collector of transistor 101 is connected to line 108 which is connected to the gate of junction field effect transistor 109, and via the parallel combination of resistor 110 and capacitor 111 to line 89. The collector of transistor 103 is connected to line 112 which is connected to the base of NPN transistor 113. Resistor 114 is connected from line 112 to power supply terminal 115. The emitters of transistors 103 and 113 are connected to line 105. The collector of transistor 113 is connected to line 116 which is connected to the gate of junction field effect transistor 117, and via the parallel combination of resistor 118 and capacitor 119 to line 91. One of the source/drain connections of transistor 109 is connected via line 120 to line 85 and the other is connected to line 121. Similarly, one of the source-drain connections of transistor 117 is connected via line 122 to line 87 and the other to line 121. Line 121 is connected via line 123 to output terminal 83.

FIG. 2 illustrates an analog switching circuit which has been used in experimental models and which may be used for analog switches 23 through 28 of FIG. 1. The circuit of FIG. 2 may also be used for analog switches 21 and 22. However, the full performance of the circuit of FIG. 2 is generally not required for the less significant bit analog switches which also do not require voltage follower amplifiers to drive the ladder resistor network.

If the circuit of FIG. 2 is used for switch 23 of FIG. 1, terminal 82 would be connected to line 15 and terminal 83 would be connected to the input of amplifier 57. Terminals 84 and 86 of FIG. 2 correspond to terminals 32 and 30 of FIG. 1 and lines 85 and 87 correspond to lines 31 and 29, respectively. Voltage follower amplifiers 88 and 90 are used to provide a reference voltage on line 89 substantially equal to that on line 85 and a reference voltage on line 91 substantially equal to that on line 87. Lines 85, 87, 89, and 91 are connected in parallel to as many of the analog switches of the type of FIG. 2 as may be used in a system. The reason for the dual set of reference voltage lines is that moderate currents may be drawn from lines 89 and 91 without affecting the voltage values on lines 85 and 87.

Gate 93 is an open collector inverter. In experimental models, a type 7405 TTL integrated circuit device has been used. A low or near ground signal on terminal 82, representing a binary 0, will cause the output of gate 93 on line 94 to be high. The current passing through resistor 96 to the emitter of transistor 95 will cause a current of substantially the same magnitude to flow through line 99, thereby turning on transistors 101 and 103. The turning on of transistor 103 will turn off transistor 113. Hence, the potential on line 108 will be pulled down to a negative value near that on terminal 107, thereby turning off field effect transistor 109. The potential on line 116 will be pulled up via resistor 118, thereby turning on field effect transistor 117 and connecting analog output terminal 83 to line 87.

A high signal of several volts positive on terminal 82, representing a binary 1, will cause the output of gate 93 on line 94 to be pulled down to near ground potential. This will turn off transistor 95 and, in turn, turn off transistors 101 and 103. The turning off of transistor 103 will turn on transistor 113. The result is that the potential on line 108 will be nearly equal to the potential on line 89 and field effect transistor 109 will be turned on. The potential on line 116 will be pulled down to nearly the potential on terminal 107, thereby turning off field effect transistor 117. The result is that analog output terminal 83 will be connected via field effect transistor 109 to line 85.

The power supply potentials applied to terminals 97, 107, and 115 will depend on the particular circuit and the range of voltages which it is designed to switch. Typically, in systems using TTL integrated circuit logic devices or other logic devices operating on a +5 volt power system, a potential of +5 volts will be applied to terminal 97. The potential applied to terminal 107 will typically be in the range of −10 to −30 volts, and terminal 115 may be grounded.

The function of capacitors 111 and 119 is to slightly delay the positive rise of potential on lines 108 and 116 uring switching. When the control input to the switch circuit of FIG. 2 is changed, whichever of lines 108 and 116 is being turned off will be pulled down quickly, thereby quickly turning off the associated field effect transistor. The potential on the positive going line will rise more slowly. The result is that the switching action is of a non-shorting type rather than a shorting type and a momentary short across lines 85 and 87 is avoided.

Figure 3:
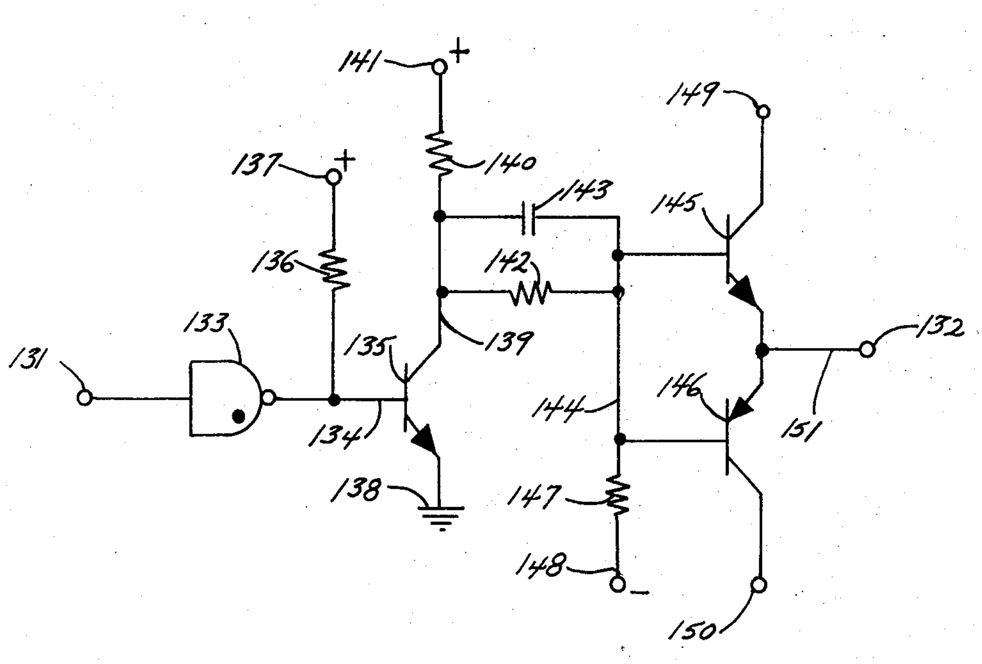
FIG. 3 is a circuit diagram showing a bipolar transistor type of analog switch which may be used for certain of the analog switches shown in FIGS. 1 and 7.

Reference is now made to FIG. 3 which is a circuit diagram showing a bipolar transistor type of analog switch which may be used for certain of the analog switches shown in FIGS. 1 and 7. In FIG. 3, the analog switch circuit is connected to control input terminal 131 and output terminal 132. Control input terminal 131 is connected to the input of open collector inverter 133. The output of inverter 133 is connected to line 134 which is connected to the base of NPN transistor 135. Resistor 136 is connected from lines 134 to power supply terminal 137. The emitter of transistor 135 is connected to ground 138. The collector of transistor 135 is connected to line 139 which is connected via resistor 140 to power supply terminal 141. Line 139 is connected via the parallel combination of resistor 142 and capacitor 143 to line 144 which is connected to the bases of NPN transistor 145 and PNP transistor 146. Line 144 is connected via resistor 147 to power supply terminal 148. The collector of transistor 145 is connected to terminal 149 and the collector of transistor 146 is connected to terminal 150. The emitters of transistors 145 and 146 are connected to line 151 which is connected to terminal 132.

FIG. 3 illustrates an analog switching circuit which may be used for analog switches 21 and 22 of FIG. 1 and, in general, for analog switching where the full accuracy and performance of a switching circuit such as shown in FIG. 2 is not required. If the circuit of FIG. 3 is used for switch 21, terminal 131 would be connected to line 13, terminal 132 would be connected to line 55, and terminals 149 and 150 would be connected to lines 31 and 29 respectively.

The circuit of FIG. 2 uses field effect transistors as the analog switching elements. An advantage of field effect transistors as analog switches is that they have substantially no inherent offset voltage. The principal error introduced by the use of field effect transistors for analog switching is that due to their internal resistance. However, since the circuit of FIG. 2 is used to drive buffer amplifiers, these internal resistances contribute little error.

The circuit of FIG. 3 uses bipolar transistors for switching. Bipolar transistors, when used as analog switching devices in the manner of FIG. 3, offer a relatively low internal resistance. However, they generally do have an internal offset voltage. However, the circuit of FIG. 3 is generally satisfactory for the less significant bits of a digital to analog converter.

Gate 133 is an open collector inverter. In a particular model, a type 7405 open collector TTL integrated circuit device has been used. The power supply potential applied to terminal 137 will be a value compatible with the logic circuit elements used. For TTL integrated circuit devices, a potential of +5 volts is suitable. The power supply potentials applied to terminals 141 and 148 will normally be of equal magnitude and opposite polarity and in the range of 15 to 30 volts, depending on the range of analog voltages to be switched. Terminal 132 is the analog output of the circuit of FIG. 3. A first reference voltage is applied to terminal 149 and a second reference voltage, more negative than the first reference voltage, is applied to terminal 150. The object of the circuit of FIG. 3 is to effectively connect terminal 132 to either terminal 149 or terminal 150, depending on the state of the input signal on terminal 131.

A low or near ground signal on terminal 131, representing a binary 0, will turn off the output transistor of gate 133 allowing the potential on line 134 to rise and turning on transistor 135. This will pull down the potential on line 139 to near ground potential, causing a negative potential on line 144, turning off transistor 145 and turning on transistor 146. The result is that terminal 132 is effectively connected to terminal 150 via transistor 146. A high signal on terminal 131, representing a binary 1, will cause gate 133 to pull the potential on line 134 down to near ground and turn off transistor 135. This will cause the potential on line 144 to become positive, turning on transistor 145 and turning off transistor 146. Terminal 132 will then be effectively connected to terminal 149 via transistor 145. Capacitor 143 serves to speed up the process of turning transistors 146 and 145 on and off.

Whichever of transistors 145 and 146 is turned on will be turned on in the so-called inverted mode. The advantage of using a transistor in the inverted mode for switching is that it establishes a low resistance connection between the emitter and collector with a relatively small offset voltage.

Figure 4:
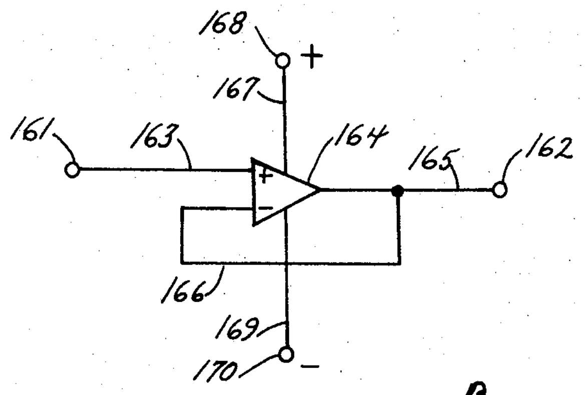
FIG. 4 is a circuit diagram showing the connection of an operational amplifier in a voltage follower amplifier circuit which may be used for at least some of the voltage follower amplifiers shown in FIGS. 1 and 7.

Reference is now made to FIG. 4 which is a circuit diagram showing the connection of an operational amplifier in a voltage follower amplifier circuit. The arrangement of FIG. 4 may be used for at least some of the voltage follower amplifiers shown in FIGS. 1 and 7. The circuit of FIG. 4 is connected to input terminal 161 and output terminal 162. Input terminal 161 is connected via line 163 to the positive input of operational amplifier 164. The output of amplifier 164 is connected via line 165 to output terminal 162. The output of amplifier 164 is also connected via line 166 from line 165 to the negative input of amplifier 164. The positive power supply connection point of amplifer 164 is connected via line 167 to positive power supply terminal 168 and the negative power supply connection point of amplifier 164 is connected via line 169 to negative power supply terminal 170.

The circuit of FIG. 4 may be used, for example, for amplifiers, 57, 59, and 61 of FIG. 1. If the circuit of FIG. 4 is used for amplifier 57, terminal 161 would be connected to the analog output of switch 23 and terminal 162 would be connected to line 58.

FIG. 4 is included for completeness of illustration to show the connection of an operational amplifier in a voltage follower circuit of the type used in experimental models. In operational models, a type 741 integrated circuit amplifier has been used for slow and medium speed converters. A type 531 integrated circuit amplifier has been used for higher speed converters. With such integrated circuit amplifiers, and with normal ± 15 volt power supply voltages, the voltage on terminal 162 will follow the voltage on terminal 161 over a range of ± 10 volts with an accuracy of a few millivolts. The principal errors will be an offset voltage, which is substantially constant over the entire range, and a deviation from exact unity gain due to imperfect common mode rejection of the integrated circuit amplifier. With typical integrated circuit amplifiers, the offset voltage will not be more than a few millivolts and the gain can be expected to be in the range of 0.999 to 1.001.

As explained earlier, a constant offset voltage will have little effect on the linearity of the overall converter. However, if the amplifier circuit of FIG. 4 is used for the more significant bits of a high accuracy converter, the imperfect common mode rejection of the amplifier used in the circuit of FIG. 4 may adversely affect the overall converter linearity. In an experimental model of a 15-bit converter, the first or four least significant bits were constructed without buffer amplifiers in the general manner of the two bits associated with switches 21 and 22 of FIG. 1. The intermediate 6 bits were constructed using buffer amplifier circuits of the type shown in FIG. 4. The five most significant bit circuits required more accurate voltage follower amplifier circuits such as shown in FIG. 5.

Figure 5:
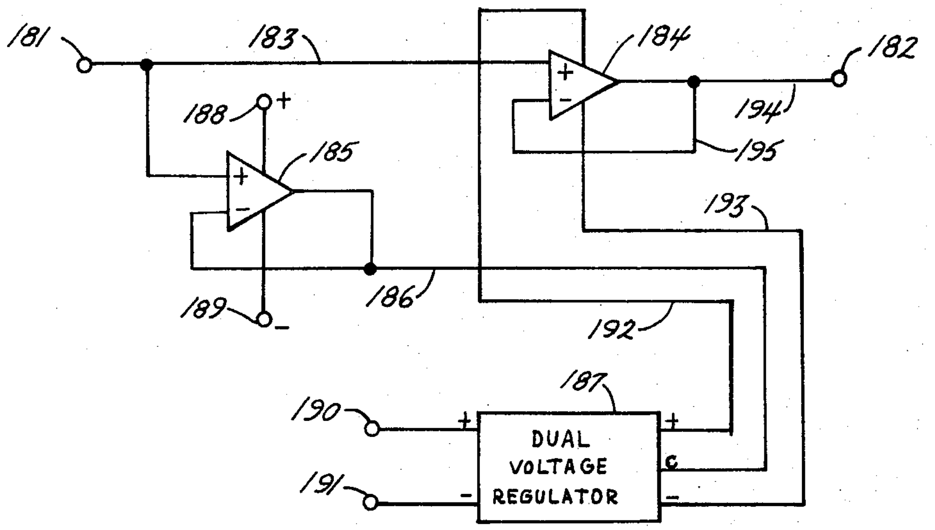
FIG. 5 is a circuit diagram showing a higher accuracy voltage follower amplifier circuit which may be used for some or all of the voltage follower amplifiers shown in FIGS. 1 and 7.

Reference is now made to FIG. 5 which is a circuit diagram showing a higher accuracy voltage follower amplifier circuit which may be used for some or all of the voltage follower amplifiers shown in FIGS. 1 and 7. The circuit of FIG. 5 is connected to input terminal 181 and output terminal 182. Input terminal 181 is connected via line 183 to the positive input of operational amplifier 184 and to the positive input of operational amplifier 185. The output of amplifier 185 is connected via line 186 to the negative input of amplifier 185 and to the common terminal of dual voltage regulator 187. The positive power supply connection point of amplifier 185 is connected to positive power supply terminal 188 and the negative power supply connection point of amplifier 185 is connected to negative power supply terminal 189. Power supply terminals 190 and 191 are connected to the unregulated input points of regulator 187. The regulated positive output of regulator 187 is connected via line 192 to the positive power supply point of amplifier 184 and the negative regulated output of regulator 187 is connected via line 193 to the negative power supply point of amplifier 184. The output of amplifier 184 is connected via line 194 to terminal 182 and via line 195 to the negative input of amplifier 184.

The circuit of FIG. 5 may be used for any or all of amplifiers 57, 59, 61, 63, 65, and 67 of FIG. 1. It is particularly appropriate for the more significant bit amplifiers, such as amplifiers 65 and 67. If the circuit of FIG. 5 is used for amplifier 65, terminal 181 would be connected to the analog output of switch 27 and terminal 182 would be connected to line 66.

In the circuit of FIG. 5, two voltage follower amplifiers are connected to input terminal 181. Amplifier 185 drives the common point of dual voltage regulator 187 so that the regulator provides power supply voltages which are positive and negative with respect to line 186. In experimental models, regulator 187 was a type 2501 integrated circuit dual voltage regulator which provided an output on line 192 of +15 volts and an output on line 193 of −15 volts, both relative to line 186. The power supply potentials applied to terminals 190 and 191 were of equal magnitude and opposite polarity and in the range of 25 to 30 volts magnitude. Thus, the power supply voltages applied to operational amplifier 184 will track the input voltage on line 183 and amplifier 184 will experience substantially no common mode voltage. This will substantially reduce any errors due to common mode voltage inputs, and results in the circuit of FIG. 5 functioning as a voltage follower amplifier with a gain which is extremely close to 1. There may, of course, still be a moderate offset voltage of the order of a few millivolts. However, as described earlier, such offset voltages are generally of little consequence.

Figure 6:
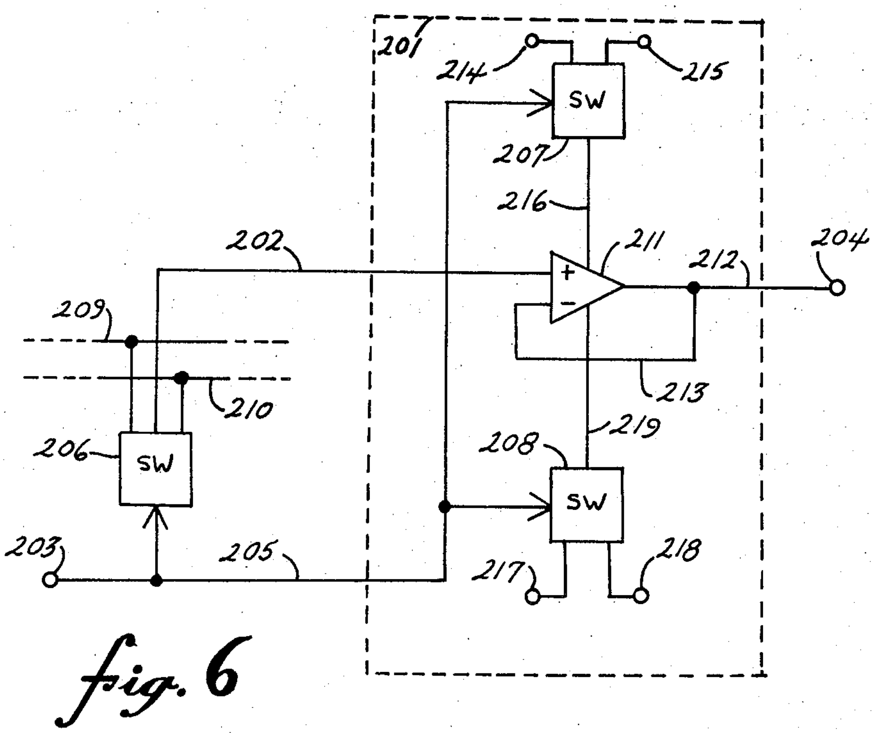
FIG. 6 is a circuit diagram showing an additional form of higher accuracy voltage follower amplifier circuit which may be used for some or all of the voltage follower amplifiers shown in FIGS. 1 and 7.

Reference is now made to FIG. 6 which is a circuit diagram showing an additional form of higher accuracy voltage follower amplifier circuit which may be used for some or all of the voltage follower amplifiers shown in FIGS. 1 and 7. In FIG. 6, voltage follower amplifier circuit 201 is connected to analog input line 202, control input terminal 203, and output terminal 204. Control input terminal 203 is connected via line 205 to the control input of analog switch 206 and to the control inputs of voltages switches 207 and 208. Line 209 is connected to a first or low analog input of analog switch 206 and line 210 is connected to the second or high analog input of switch 206. The output of analog switch 206 is connected via line 202 to the positive input of operational amplifier 211. The output of amplifier 211 is connected via line 212 to output terminal 204, and via line 213 to the negative input of amplifier 211. A first or low input of voltage switch 207 is connected to terminal 214 and the second or high input is connected to terminal 215. The output of switch 207 is connected via line 216 to the positive power supply input point of amplifier 211. Terminal 217 is connected to the first or low input of voltage switch 208 and terminal 218 is connected to the second or high input of switch 208. The output of switch 208 is connected via line 219 to the negative power supply input point of amplifier 211.

FIG. 5 illustrates the use of a floating and driven power supply to reduce the apparent common mode voltage applied to a voltage follower amplifier and thereby achieve a more precise unity gain. The circuit of FIG. 5 is capable of precisely amplifying signals which may vary continuously over a considerable range. With typical integrated circuit devices now available, the range might be −10 volts to +10 volts. However, in the circuits of the subject invention such as shown in FIG. 1, it is only necessary to precisely switch and amplify signals of two predetermined potential values. FIG. 6 shows a combination analog switch and voltage follower amplifier circuit which provides the performance capability of the combination of the switch of FIG. 2 and the amplifier circuit of FIG. 5.

In a model, the circuit of FIG. 6 was used with reference potential values of −8 volts on line 209 and +8 volts on line 210. Power supply potentials of +7 volts, +23 volts, −23 volts and −7 volts were applied to terminals 214, 215, 217, and 218 respectively. Analog switch 206 may be of the type shown in FIG. 2 and operates to effectively connect line 202 to line 209 if the control signal on line 205 is low and to effectively connect line 202 to line 210 if the control signal on line 205 is high. Switch 207 effectively connects line 216 to terminal 214 if the signal on line 205 is low and effectively connects line 216 to terminal 215 if the signal on line 205 is high. Switch 208 effectively connects line 219 to terminal 217 if the signal on line 205 is low and effectively connects line 219 to terminal 218 if the signal on line 205 is high. Thus, if the signal on line 205 is low, the analog signal on line 202 will be −8 volts, the power supply voltage on line 216 will be +7 volts and the power supply voltage on line 219 will be −23 volts. The output on terminal 204 will be substantially equal to −8 volts.

If the signal on line 205 is high, the analog signal on line 202 will be +8 volts, the power supply voltage on line 216 will be +23 volts and the power supply voltage on line 219 will be −7 volts. The output voltage on terminal 204 will be substantially equal to +8 volts. The power supply voltages on lines 216 and 219 are switched between two values so that they track or follow the analog signal voltage on line 202 for the two principal analog signal voltages. Although the circuit of FIG. 6 is not capable of providing the performance of a high accuracy voltage follower over an entire range of analog signal input voltages, it is capable of providing high accuracy performance for two predetermined voltages such as in the circuit of FIG. 1.

The circuit of FIG. 6 may be used, for example, in place of switch 26 and amplifier 63, switch 27 and amplifier 65, and/or switch 28 and amplifier 67 of FIG. 1. If the circuit of FIG. 6 is used for switch 26 and amplifier 63, terminal 203 would be connected to line 18, terminal 204 would be connected to line 64, and lines 209 and 210 would correspond to lines 29 and 31 respectively.

Reference is now made to FIG. 7 which is a circuit diagram showing a second form of the invention arranged as a digital to analog converter and incorporating a current summing resistor network for the summation of individual analog voltages. In digital to analog converter 221 of FIG. 7, lines 222, 223, 224, 225, 226, 227, 228, and 229 are connected to the control inputs of analog switches 230, 231, 232, 233, 234, 235, 236, and 237 respectively. Line 238 is connected to reference voltage terminal 239 and to a first or low input of analog switches 230 through 237. Line 240 is connected to reference voltage terminal 241 and to the second or high input of analog switches 230 through 237. The multiple resistor summing network includes resistors 242, 243, 244, 245, 246, 247, 248, 249, and 250. One side of each of resistors 242 through 250 is connected to line 251 which is connected to analog output terminal 252. Resistor 242 is connected between line 238 and line 251. The output of analog switch 230 on line 253 is connected through resistor 243 to line 251. Similarly, the output of analog switch 231 on line 254 is connected through resistor 244 to line 251. The output of analog switch 232 is connected to the input of voltage follower amplifier 255 whose output on line 256 is connected through resistor 245 to line 251. Similarly, the output of analog switch 233 is connected to the input of voltage follower amplifier 257 whose output on line 258 is connected through resistor 246 to line 251; the output of analog switch 234 is connected to the input of voltage follower amplifier 259 whose output on line 260 is connected through resistor 247 to line 251; the output of analog switch 235 is connected to the input of voltage follower amplifier 261 whose output on line 262 is connected through resistor 248 to line 251; the output of analog switch 236 is connected to the input of voltage follower amplifier 263 whose output on line 264 is connected through resistor 249 to line 251; and the output of analog switch 237 is connected to the input of voltage follower amplifier 265 whose output on line 266 is connected through resistor 250 to line 251.

Converter 221 of FIG. 7 generally resembles converter 11 of FIG. 1 except for the nature of the resistor network used to sum the individual voltages to obtain a composite converter output voltage. Lines 222 through 229 correspond to lines 13 through 20, terminals 239 and 241 correspond to terminals 30 and 32, and terminal 252 corresponds to terminal 54. The resistor network consisting of resistors 242 through 250 is a current summing network rather than the ladder network used in FIG. 1. For binary converters, the resistors associated with each individual bit is twice as large as the resistor associated with the next more significant bit. The terminating resistor, resistor 242, is of the same value as the least significant bit resistor, resistor 243. In the circuit of FIG. 7, resistors 242 through 250 would have relative values of 128R, 128R, 64R, 32R, 16R, 8R, 4R, 2R and R ohms, respectively, where R would be typically in the range of a few thousand ohms. The advantage of the circuit of FIG. 7 is that it requires a smaller total number of resistors. The disadvantage is that a much greater range of individual resistance values is required.

Figure 8:
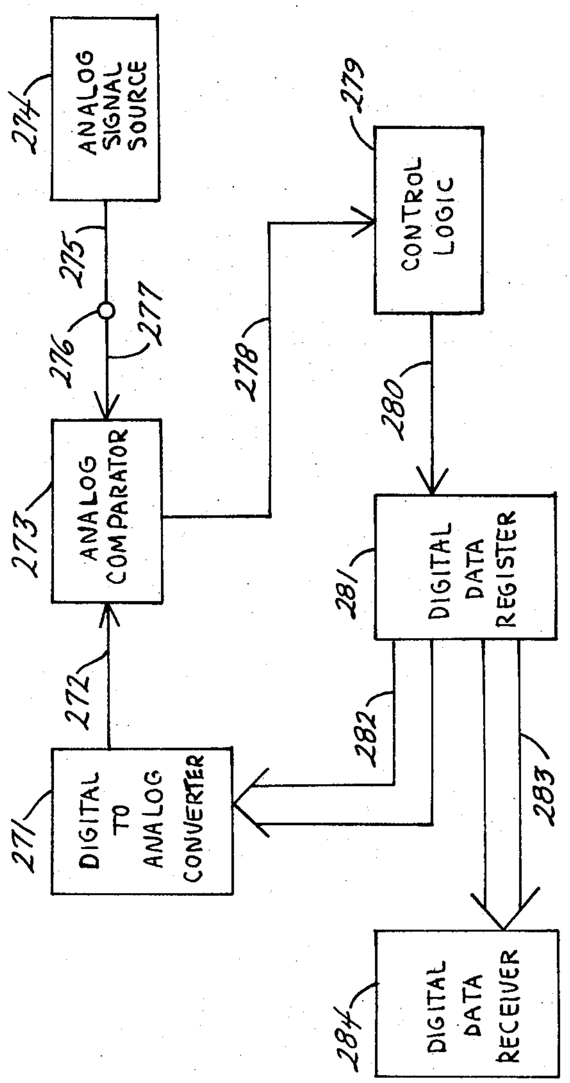
FIG. 8 is a block diagram showing a third form of the invention arranged as an analog to digital converter.

Reference is now made to FIG. 8 which is a block diagram showing a third form of the invention arranged as an analog to digital converter. In FIG. 8, the analog output of digital to analog converter 271 is connected via line 272 to a first analog input of analog comparator 273. The output of analog signal source 274 is connected via line 275 to terminal 276 which is connected via line 277 to the second analog input of analog comparator 273. The output of analog comparator 273 is connected via line 278 to control logic 279. Control logic 279 is connected via line 280 to digital data register 281. Digital data register 281 is connected via data path 282 to digital to analog converter 271 and via data path 283 to digital data receiver 284. Lines 272, 275, 277, 278, and 280, and data paths 282 and 283 show signal connections and are not necessarily single connections.

FIG. 8 is included for completeness of illustration to show the application of the subject invention to an analog to digital converter. Digital to analog converter 271 is a digital to analog converter incorporating the subject invention such as shown in FIGS. 1 to 7. The output of converter 271 on line 272 is compared with an analog input signal on terminal 276 and line 277 whose value is to be converted to a digital number. If the voltages are not substantially equal, the number in digital data register 281 is adjusted so as to bring the voltage on line 272 to substantial equality with the voltage on line 277. The number in digital data register 281 then corresponds to the analog voltage on line 277. This number is transmitted via data path 283 to digital data receiver 284 to be used as desired. Digital data receiver 284 may be a digital computer system, a digital indicator, or such other digital data receiver as may be desired.

For convenience and clarity of illustration, the digital to analog converters shown in FIGS. 1 and 7 of this application are eight-bit converters. The extension of the concepts disclosed herein to other converters with greater or lesser number of bits will be evident from the repetitive nature of the circuitry.

FIG. 1 has shown the use of a ladder type resistor network in the subject invention and FIG. 7 has shown the use of a current summing resistor network. The exact nature of the resistor network is not a substantial part of the invention. For example, circuits incorporating the subject invention may be devised in which two or more groups of bit circuits are constructed as current summing resistor circuits and then coupled via one or more series resistors in the general manner of a ladder network. Such combination resistor networks tend to share some of the characteristics, advantages, and disadvantages of straight ladder networks and straight summing resistor networks.

The preceding description has been in terms of the conversion of binary digital data words into analog voltages. Similar converters incorporating the subject invention may also be constructed for the conversion of digital data words coded in other manners. For example, the circuit of FIG. 7 may be arranged for the conversion of a two-digit decimal data word coded as two binary coded decimal digits. In such cases, the values of the individual resistors would be chosen so as to reflect the proper binary coded decimal weighting.

The specification has described the operation of the subject invention in systems incorporating two reference voltage sources, one of which may be as simple as a direct connection to a ground or reference voltage point. In many instances, it will be desirable to employ sources of substantially constant reference voltages so that the analog output voltage of the converter system will be simply proportional to the value of the input digital data word. However, in certain applications, it will be useful to employ variable reference voltage sources and/or external signal sources for one or both of the reference voltage sources. The analog output of the converter system will then be a function of the form $A \times D + B(1 - D)$ where A and B are the two reference voltage values and D is a quantity, generally in the range of 0 to 1, corresponding to the value of the input digital data word.

What is claimed is:

1. A digital to analog conversion system including a digital signal source providing a digital signal, an analog output terminal, a resistance network, means to connect said resistance network to said output terminal, a source of a first reference voltage, a source of a second different reference voltage, a voltage follower amplification means having an input and an output, switching means selectively connecting said first reference voltage source and said second reference voltage source to said input of said amplification means, means connecting said output of said amplification means to said resistance network, means connecting said digital signal source to said switching means such that said input of said amplification means is effectively connected to said first reference voltage source when the digital signal transmitted by said digital signal source is of a first predetermined state, and is effectively connected to said second reference voltage source when said digital signal is of a second predetermined state, said voltage follower amplification means including a voltage follower amplifier having at least one power input, and power supply means providing a plurality of power supply voltages, each referenced in a desired manner to voltage of the first and second reference voltage sources, means connecting said input of said amplification means to an input of said voltage follower amplifier, means connecting an output of said voltage follower amplifier to said output of said amplification means, means connecting said power supply voltages to the power input of said voltage follower amplifier including means for switching the voltage on said power input in response to said digital signal such that the difference of the voltages on said input of said amplification means and on said power input remains substantially constant whether said input of said amplification means is effectively connected through said switching means to said first reference voltage source or to said second reference voltage source.

2. The combination of claim 1 further characterized by said digital signal being a digital data word coded in the form of a plurality of binary bit signals and by said first and second switching means being responsive to and controlled by the state of a predetermined one of said binary bit signals.

3. The combination of claim 2 further characterized by said voltage follower amplifier having power inputs comprising first and second power supply terminals and said power supply means providing first, second, third and fourth power supply voltages, said means for switching the voltage on said power input including first power supply connecting means connecting said first and second power supply voltages to said first power supply terminal of said voltage follower amplifier, and second power supply connecting means connecting said third and fourth power supply voltages to said second power supply terminal of said voltage follower amplifier, said first and second power supply connecting means being responsive to the state of said predetermined one of said binary bit signals such that when said binary bit signal is of a first predetermined state said power supply terminals of said voltage follower amplifier are effectively connected to said first and third power supply voltages, and when said binary bit signal is of a second predetermined state said power supply terminals of said voltage follower amplifier are effectively connected to said second and fourth power supply voltages.

4. The combination of claim 3 further characterized by the differences between said first and second reference voltages, between said first and second power supply voltages, and between said third and fourth power supply voltages respectively being substantially equal.

5. The combination of claim 3 further characterized by the values of said first, second, third, and fourth power supply voltages being such that the differences between the voltage on said input of said amplification means and the voltages on each of said power supply terminals of said voltage follower amplifier are substantially constant for the two states of said binary bit signal.

6. The combination of claim 1 further characterized by said digital to analog conversion system being incorporated in an analog to digital conversion system including an analog input signal source, means for comparing the analog signal at said analog output terminal and the analog signal from said analog input signal source, means responsive to said comparison for adjusting said digital data word transmitted by said digital data word source so as to maintain said analog signal at said analog load and said analog signal from said analog input signal source at substantial equality, digital data receiver means, and means connecting said digital signal source to said digital data receiver means.

* * * * *

PO-1050
(5/69)

UNITED STATES PATENT OFFICE
CERTIFICATE OF CORRECTION

Patent No. 3,828,345 Dated August 6, 1974

Inventor(s) Tenny D. Lode

It is certified that error appears in the above-identified patent and that said Letters Patent are hereby corrected as shown below:

Column 1, line 38, "." should be --,--. Column 6, line 22, "of" should be --on--. Column 14, line 5, "to" should be --or--. Column 16, line 42 (Claim 6, line 9), "data word" should be --signal--.

Signed and sealed this 29th day of October 1974.

(SEAL)
Attest:

McCOY M. GIBSON JR.
Attesting Officer

C. MARSHALL DANN
Commissioner of Patents